(12) United States Patent
Usami et al.

(10) Patent No.: US 8,187,563 B2
(45) Date of Patent: May 29, 2012

(54) METHOD FOR PRODUCING SI BULK POLYCRYSTAL INGOT

(75) Inventors: Noritaka Usami, Sendai (JP); Kazuo Nakajima, Sendai (JP); Isao Takahashi, Sendai (JP)

(73) Assignees: Tohoku Technoarch Co., Ltd., Sendai-shi (JP); Daiichi Kiden Co., Ltd., Chofu-shi (JP)

(*) Notice: Subject to any disclaimer, the term of this patent is extended or adjusted under 35 U.S.C. 154(b) by 59 days.

(21) Appl. No.: 12/671,139

(22) PCT Filed: Jul. 31, 2008

(86) PCT No.: PCT/JP2008/063785
§ 371 (c)(1),
(2), (4) Date: Jan. 28, 2010

(87) PCT Pub. No.: WO2009/017201
PCT Pub. Date: Feb. 5, 2009

(65) Prior Publication Data
US 2010/0202955 A1    Aug. 12, 2010

(30) Foreign Application Priority Data

Aug. 2, 2007  (JP) .................................. 2007-201697
Apr. 18, 2008  (JP) .................................. 2008-108887

(51) Int. Cl.
| | |
|---|---|
| C01B 33/02 | (2006.01) |
| B22D 27/04 | (2006.01) |
| B22D 7/10 | (2006.01) |
| B22D 15/00 | (2006.01) |
| C30B 9/00 | (2006.01) |
| C30B 11/00 | (2006.01) |
| C30B 17/00 | (2006.01) |
| C30B 21/02 | (2006.01) |
| C30B 28/06 | (2006.01) |

(52) U.S. Cl. ........ 423/348; 164/125; 164/126; 164/127; 117/73

(58) Field of Classification Search .......... 423/348–349; 164/122–128; 117/37, 73, 81–82
See application file for complete search history.

(56) References Cited

U.S. PATENT DOCUMENTS 4,770,704 A * 9/1988 Gibson et al. .................. 164/471
(Continued)

FOREIGN PATENT DOCUMENTS

| JP | 10-194718 A | 7/1998 |
|---|---|---|
| JP | 2005-132671 A | 5/2005 |
| JP | 2007-45640 A | 2/2007 |
| WO | WO 2007/063637 A1 | 6/2007 |

OTHER PUBLICATIONS

Machine Translation of JP2007-045640, Nakajima Kazuo et al., Feb. 22, 2007.*

(Continued)

*Primary Examiner* — Stanley Silverman
*Assistant Examiner* — Anthony J Zimmer
(74) *Attorney, Agent, or Firm* — Crowell & Moring LLP

(57) ABSTRACT

A method is provided for producing a Si bulk polycrystal ingot with high quality and high homogeneity, which has no significant crystal defects and is free from diffused impurities with a high yield. An upper face of a Si melt is locally cooled by bringing coolant close to a surface of the Si melt from an upper part of a crucible in the crucible containing the Si melt or by inserting the coolant into the Si melt. A dendrite crystal is formed in the vicinity of the surface of the Si melt. Cooling is performed thereafter while maintaining a proper temperature distribution, and a Si bulk crystal is grown from an upper part toward a lower part using a lower face of the dendrite crystal as a fresh growth face.

9 Claims, 4 Drawing Sheets

U.S. PATENT DOCUMENTS

| | | | |
|---|---|---|---|
| 5,275,227 A * | 1/1994 | Staub | 164/122.1 |
| 5,291,937 A * | 3/1994 | Corderman et al. | 164/92.1 |
| 5,673,744 A * | 10/1997 | Bewlay et al. | 164/80 |
| 5,673,745 A * | 10/1997 | Jackson et al. | 164/80 |
| 5,676,191 A * | 10/1997 | Bewlay et al. | 164/80 |
| 5,743,322 A * | 4/1998 | Jackson et al. | 164/98 |
| 5,778,960 A * | 7/1998 | Jackson et al. | 164/98 |
| 5,904,201 A * | 5/1999 | Jackson et al. | 164/80 |
| 5,916,384 A * | 6/1999 | Das | 148/522 |
| 6,343,641 B1 * | 2/2002 | Gigliotti et al. | 164/122.1 |
| 6,503,563 B1 * | 1/2003 | Yatsurugi et al. | 427/255.27 |
| 7,017,646 B2 * | 3/2006 | Balliel et al. | 164/122.1 |
| 7,538,044 B2 * | 5/2009 | Shimamune et al. | 438/764 |
| 2005/0103462 A1 * | 5/2005 | Balliel et al. | 164/122.1 |

OTHER PUBLICATIONS

Fujiwara et al., "Growth of sturcture-controlled polycrystalline silicon ingots for solar cells by casting", Acta Materialia 54 (2006) 3191-3197.*

Fujiwara et al., "Directional growth method to obtain high quality polycrystalline silicon from its melt", Journal of Crystal Growth 292 (2006) 282-285.*

G. Martinelli, et al., "Growth of stable dislocation-free 3-grain silicon ingots for thinner slicing", Appl. Phys. Lett., 1993, 62, p. 3262-3263.

International Search Report dated Oct. 14, 2008 with English translation (four (4) pages).

* cited by examiner

FIG. 3A
DENDRITE CRYSTAL 3
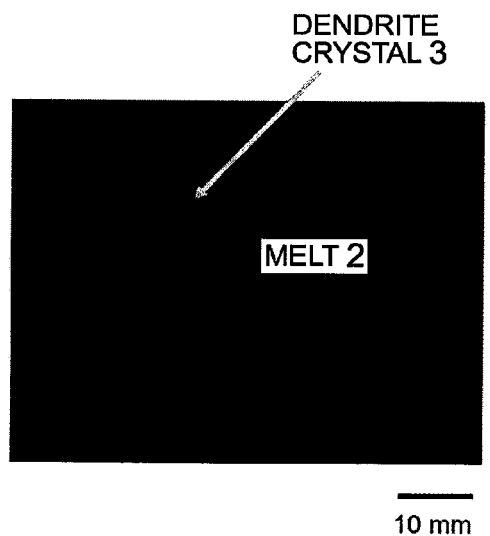
MELT 2
10 mm
FIG. 3B
COARSENED DENDRITE CRYSTAL 3
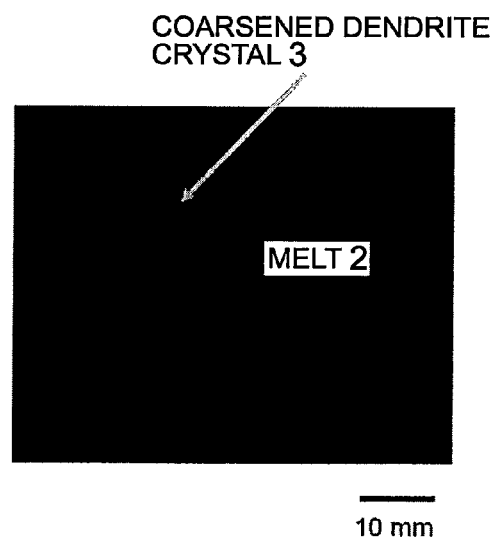
MELT 2
10 mm
FIG. 4A WITH LOCAL COOLING
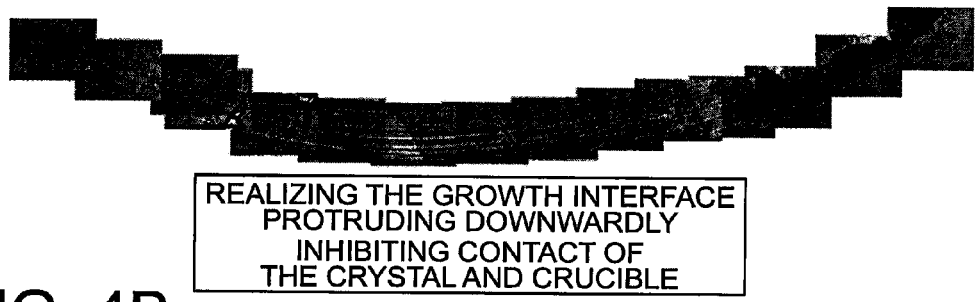
REALIZING THE GROWTH INTERFACE PROTRUDING DOWNWARDLY INHIBITING CONTACT OF THE CRYSTAL AND CRUCIBLE
FIG. 4B WITHOUT LOCAL COOLING
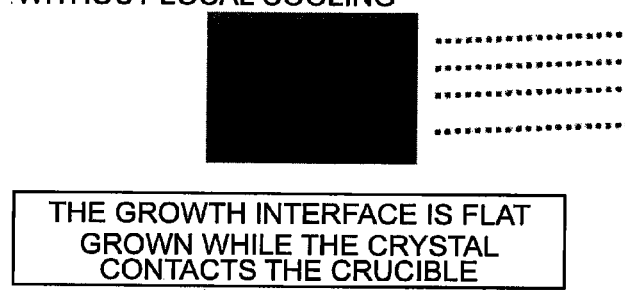
THE GROWTH INTERFACE IS FLAT GROWN WHILE THE CRYSTAL CONTACTS THE CRUCIBLE

FIG. 5A
WHEN HEAT REMOVAL BY LOCAL COOLING IS APPROPRIATE

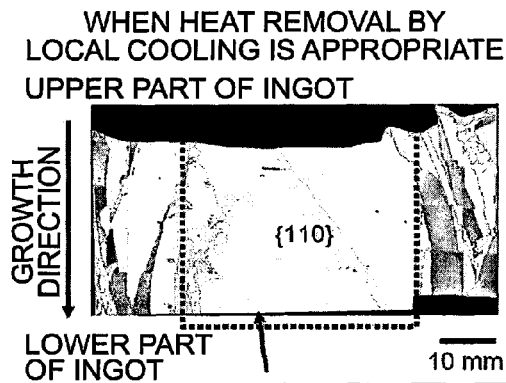

UPPER PART OF INGOT
GROWTH DIRECTION
LOWER PART OF INGOT
10 mm

GROWN FROM A SINGLE DENDRITE CRYSTAL IN THE CENTER PART
REALIZING A GIGANTIC GRAIN WITH UNIFORM ORIENTATION

FIG. 5B
WHEN THE HEAT REMOVAL AMOUNT IS EXCESSIVE

GROWN FROM A PLURALITY OF DENDRITE CRYSTALS IN THE CENTER PART
ORIENTATION DISTRIBUTION IS INCREASED

FIG. 6A
INTENSITY IMAGE [220] DIFFRACTION

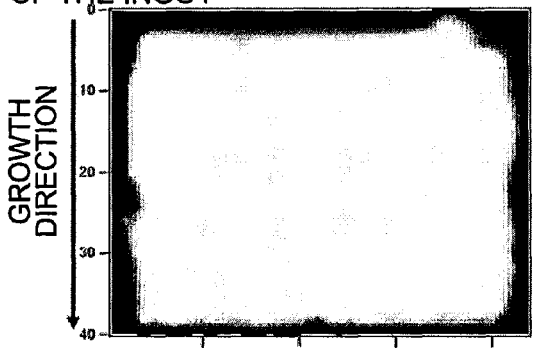

UPPER PART OF THE INGOT
GROWTH DIRECTION
LOWER PART OF THE INGOT

FIG. 6B
SUB-GRAIN BOUNDARY IMAGE

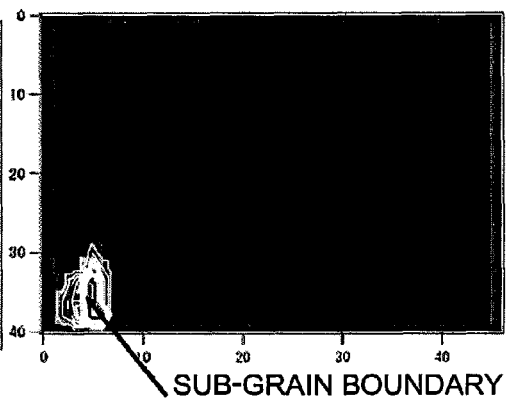

SUB-GRAIN BOUNDARY GENERATION REGION

FIG. 7

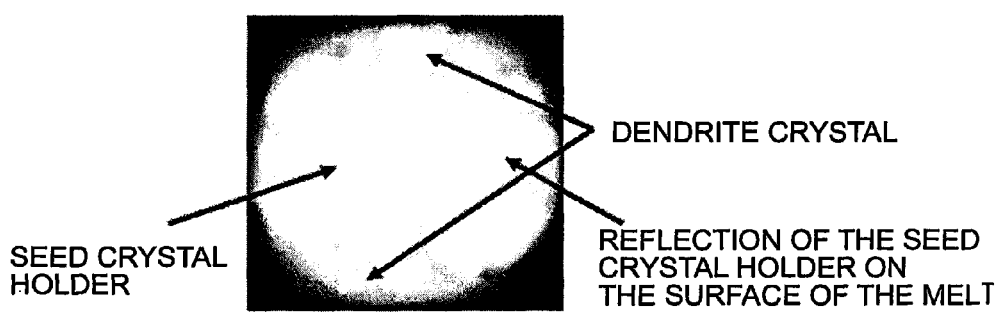

DENDRITE CRYSTAL
SEED CRYSTAL HOLDER
REFLECTION OF THE SEED CRYSTAL HOLDER ON THE SURFACE OF THE MELT

METHOD FOR PRODUCING SI BULK POLYCRYSTAL INGOT

TECHNICAL FIELD

The present invention relates to a method for producing a Si bulk polycrystal ingot for a solar cell.

BACKGROUND ART

The solar cell is spreading rapidly as a clean energy source replacing fossil fuels. At present, majority of the solar cell for practical use is the solar cell using the Si bulk crystal, particularly the market share of the Si bulk polycrystal is overwhelmingly high. The present invention relates to production of the Si bulk polycrystal ingot of high quality and a high yield by upgrading the total ingot using a practical method for producing according to a cast growth method used most generally with respect to the Si bulk polycrystal which has been put into use most and has secured a biggest share in the solar cell market.

In order to really deploy most safe and environment-friendly solar cell of the Si-based bulk polycrystal on a global scale, technological development enabling the low cost and high yield production of highly efficient solar cell using safe Si resources which are present richly is required. At present in the country and overseas, the main stream of the practical technology is the method for producing a solar cell by growing a large volume Si bulk polycrystal by a cast method using unidirectional growth from a Si melt and cutting out into a thin sheet wafer. However, the biggest problem of the Si bulk polycrystal grown by the unidirectional growth cast method which is an ordinary cast growth method is that many small grains are formed in the early stage of the growth, the crystallographic orientation of these grains is random, the ratio of the crystal boundaries which are the random grain boundaries is high, and the Si bulk polycrystal with high quality cannot be secured over the entire ingot.

These random grain boundaries affect the solar cell performance adversely and are present over the entire Si bulk polycrystal ingot. Due to these causes, in the Si bulk polycrystal ingot produced by the ordinary cast growth method, the yield of the ingot which is the ratio usable as a solar cell as a result is dropped down to approximately 60%.

Also, because the orientation distribution of the crystal grains of the Si bulk polycrystal produced by an ordinary cast growth method is random, it is difficult to make an excellent surface texture structure for effectively utilizing the sun light by making the sun light reflected at the solar cell surface incident on the solar cell again. Further, it has become a problem that energy conversion efficiency lowers because of the causes such that the impurities such as iron introduced to the inside of the crystal due to the production method become the recombination center of the photo-generated carriers. In addition, the dislocation present in the vicinity of the grain boundary and inside the grain also becomes a serious defect to act as a recombination center with high recombination velocity.

The present invention relates to a production technology of a Si bulk polycrystal ingot controlling the grain orientation and the grain size in a Si bulk polycrystal ingot, capable of inhibiting generation of a crystal defect such as the random grain boundary and dislocation, and capable of securing a high yield ingot without deteriorating the crystal quality. It is an important invention enabling to produce the Si bulk polycrystal ingot for a solar cell with high quality and high homogeneity (high yield), to deploy the solar cell widely to the world, and to promote to solve the energy and environment problems. Also, when the Si bulk polycrystal ingot produced by the production technology of the present invention is used, the surface texture structure is easily made, and a highly efficient solar cell can be produced due to this point also.

The Si bulk polycrystal ingot for a solar cell is produced by a cast growth method. In the cast growth method, the Si bulk polycrystal ingot is produced by solidifying a Si melt in one direction from the lower part of a crucible upwardly using the Si melt poured into the crucible which is coated with a release agent or the Si melt molten within the crucible made of the quartz which is coated with the release agent and the like.

In the Si bulk polycrystal ingot produced by an ordinary cast growth method, the grain size and the grain orientation are random because of a number of random crystal nuclei formed in the bottom face of the crucible in the early stage of the growth, majority of the grain boundaries are the random grain boundaries, a number of dislocations, sub-grain boundaries which are a kind of dislocation and impurities are present, and it is difficult to produce the Si bulk polycrystal ingot which is of high quality over the entire ingot. Also, owing to accumulation of detailed studies by the inventors, it has been clarified that the stress applied by growing of the crystal contacting the crucible is one of the causes of occurrence of the dislocation. Contact of the ingot crystal and the crucible becomes a cause of diffusion of the impurities such as iron contained in the release agent into the crystal. Therefore, in order to produce the Si bulk polycrystal ingot with high quality and high homogeneity with a high yield, it is indispensable to make the Si bulk polycrystal ingot grow not contacting the bottom face of the crucible and the side face of the crucible as much as possible.

As a publicly known technology for making the crystal grain orientation uniform, there is a method of producing a Si bulk polycrystal ingot for a solar cell with uniform orientation by arranging Si single crystals on the bottom face of a crucible and pouring a Si melt thereon (refer to Patent Document 1, for example). However, this method is not practicable from the viewpoint of the production cost because the Si single crystals are utilized as seed crystals. Also, because the Si bulk polycrystal ingot grows contacting the crucible, high quality ingot cannot be obtained.

As a publicly known technology for making the grain orientation uniform, there is a method of producing a Si bulk polycrystal ingot with uniform crystal grain orientation by making dendrite crystals with uniform growth orientation develop at the bottom face of a crucible containing a Si melt and making it unidirectionally grow on the upper face of the dendrite crystals (refer to Patent Document 2, for example). However, although this method is useful as a method to make the grain orientation uniform, it cannot prevent the contact with the crucible.

As a publicly known technology for making a Si bulk polycrystal ingot glow without contacting a crucible, there is a procedure that a melt of a semiconductor is maintained at a temperature near the melting point in a crucible, then cooling gas is blown to the melt or cooling gas is blown and a crystal and a metal bar are immersed for controlling nucleation, thereafter solidification growth is started for poly-crystallization (refer to Patent Document 3, for example). However, in this method, a method for uniformizing to a specific crystal orientation and a control procedure of a grain size are not disclosed.

As a production method for a Si bulk polycrystal ingot with uniform grain orientation in which the crystal in the middle of the growth does not contact a crucible, there is a method for growing a Si crystal by a Czochralski method with three kinds of single crystals controlled so as to include two Σ=3 grain boundaries and one Σ=9 grain boundary with a {110} plane as a growth face as a seed crystal (refer to Non-patent Document 1, for example). However, this method is not practical from the viewpoint of the production cost because an expensive Si single crystal is utilized as a seed crystal and is not suitable as a practical technology for producing a large ingot also.

Patent Document 1: Japanese Unexamined Patent Application Publication No. H10-194718
Patent Document 2: International Application Publication No. 2007/063637 pamphlet
Patent Document 3: Japanese Unexamined Patent Application Publication No. 2007-45640
Non-patent Document 1: G. Martinelli and R. Kibizov, "Growth of stable dislocation-free 3-grain silicon ingots for thinner slicing", Appl. Phys. Lett., 1993, 62, p. 3262

DISCLOSURE OF INVENTION

Problems to be Solved by the Invention

In order to manufacture a high efficiency solar cell at a low cost, a Si bulk polycrystal ingot used should be of high quality and high homogeneity and should be able to be produced with a high yield. The biggest problem of the Si bulk polycrystal grown by an ordinary cast growth method is that a number of small grains are formed in the early stage of growth, the crystallographic orientation of these crystal grains is random, the ratio of the crystal boundaries which are the random grain boundaries is high, and the Si bulk polycrystal with high quality cannot be secured over an entire ingot. Also, it is preferable that grain orientation can be limited and the texture structure for improving the efficiency of a solar cell can be made easily. In addition, it should be a high quality crystal with reduced dislocations, sub-grain boundaries and impurities which become a recombination center of a carrier.

As a production technology for a Si bulk polycrystal ingot with high quality and high homogeneity, it is necessary to develop a creative crystal growth technology which is an easy practical technology in which a crucible of quartz and the like according to an ordinary cast growth method can be used and enables the crystal growth while the ingot and the crucible do not contact with each other as much as possible during growth in order to inhibit generation of the stress and diffusion of impurities.

The present invention is to provide a Si bulk polycrystal ingot with high quality and high homogeneity that can solve all these problems and a production technology of the Si bulk polycrystal ingot with high quality and high homogeneity.

Means for Solving the Problems

In order to achieve the first object described above, according to the present invention, an upper face of a Si melt is locally cooled by bringing a coolant close to a surface of the Si melt from the upper part of a crucible or by inserting the coolant into the Si melt within the crucible containing the Si melt, a dendrite crystal is formed in the vicinity of the surface of the Si melt, thereafter the melt is cooled while maintaining a proper temperature distribution, and a Si bulk crystal can be grown from an upper part toward a lower part using a lower face of the dendrite crystal as a fresh growth face.

Also, it is characterized that the local cooling effect of the upper part of the Si melt is improved by bringing the coolant close to the surface of the Si melt and inserting the coolant into the Si melt, a dendrite crystal is formed in the vicinity of the surface of the Si melt, thereafter the melt is cooled while maintaining a proper temperature distribution, and a Si bulk crystal is grown from the upper part toward the lower part using the lower face of the dendrite crystal as the fresh growth face.

Further, it is characterized that, in the vicinity of a center of the surface of the Si melt, the coolant is brought close to the surface of the Si melt from the upper part of to make the upper part of the Si melt a position for performing local cooling, or the coolant is inserted into the Si melt thereby making the upper part of the Si melt a position for local cooling.

In order to achieve the second object described above, a Si melt inside a crucible for growing a crystal is maintained in a state with a temperature gradient that the higher in a vertical direction, the lower in the temperature, and the closer to the center in a horizontal direction, the lower in the temperature, the upper surface of the Si melt is locally cooled to increase degree of excessive cooling by bringing coolant close to the surface of the Si melt from the upper part of the crucible or by inserting the coolant into the Si melt, and a dendrite crystal is developed in the vicinity of the center part of the upper face of the Si melt, thereafter cooling is performed while maintaining a proper temperature distribution, and a Si bulk crystal can be grown from an upper part toward a lower part using the lower face of the dendrite crystal as a fresh growth face.

Also, a method for producing a Si bulk polycrystal ingot can be obtained which is characterized that the coolant is formed of predetermined cooling gas and locally cools the upper part of the Si melt by blowing the predetermined cooling gas, or the coolant is a quartz bar, a carbon bar, a silicon carbide bar, a silicon nitride bar, or a metal bar, or the coolant is a Si-based single crystal, a polycrystal, or a composite crystal combined thereof.

Also, a method for producing a Si bulk polycrystal ingot can be obtained which is characterized that the dendrite crystal develops by cooling the upper part of the Si melt locally using predetermined cooling gas or develops by any of the quartz bar, the carbon bar, the silicon carbide bar, the silicon nitride bar, the metal bar, or the Si-based single crystal, the polycrystal, the composite crystal combined thereof which are the coolant.

Also, a method for producing a Si bulk polycrystal ingot can be obtained which is characterized that a cooling effect is improved by locally cooling the upper part of the Si melt by blowing predetermined cooling gas and inserting the coolant mainly of the Si-based single crystal, the polycrystal, or the composite crystal combined thereof, the quartz bar, the carbon bar, the silicon carbide bar, the silicon nitride bar, or the metal bar into the Si melt from the upper part of the crucible.

Also, a method for producing a Si bulk polycrystal ingot can be obtained which is characterized that the temperature distribution is set to make the temperature distribution from the liquid surface to the bottom face in the vertical direction of the crucible 0.1-50 DEG.C/cm and to make the temperature distribution from the center part to the peripheral part of the crucible 0.1-50 DEG.C/cm.

Also, a method for producing a Si bulk polycrystal ingot can be obtained which is characterized that the temperature of the center part of the Si melt prior to growth is maintained at a temperature within −20 DEG.C to +20 DEG.C against the melting point.

Also, a method for producing a Si bulk polycrystal ingot can be obtained which is characterized that the cooling gas is any one kind of helium, neon, argon, xenon, nitrogen, hydrogen, or gas mixture composed of plural kinds thereof.

Also, a method for producing a Si bulk polycrystal ingot can be obtained which is characterized that growth orientation of the Si bulk crystal from the lower face of the dendrite crystal is made [110] or and a fluctuation range of the growth orientation of the Si bulk crystal is made −10 DEG. to +10 DEG. while maintaining growth of the dendrite crystal from development of the dendrite crystal.

Advantages

Because the dendrite crystal is developed in the upper part of the melt and crystal growth is performed using the lower face of the dendrite crystal as a fresh growth face, the face orientation of the Si bulk polycrystal can be limited to a specific face orientation.

Because the Si bulk polycrystal starts to grow locally from the upper part of the melt, the contact time of the ingot crystal and the crucible can be shortened compared with the conventional technique in which the growth starts from the bottom part of the crucible. Accordingly, the stress introduced to the ingot crystal due to thermal distortion against the crucible face is less, and generation of the crystal defect and diffusion of impurities due to the stress can be reduced. Furthermore, the grain size, the grain orientation, and the character of the grain boundary also can be controlled by controlling the density of the dendrite crystal, and an ideal Si bulk polycrystal ingot with high quality and high homogeneity can be produced with a high yield.

In addition, because the ingot crystal and the crucible face do not strongly contact with each other, the impurities included in the release agent inside the crucible are inhibited from diffusing into the ingot crystal, therefore a crystal with high purity can be produced.

Thus, it is possible to produce an ideal Si bulk polycrystal ingot with high quality and high homogeneity with less crystal defect, with less impurities from the crucible, and with controlled grain size, the grain orientation, and the nature of the grain boundary with a high yield.

BRIEF DESCRIPTION OF DRAWINGS

FIG. 3 shows a dendrite crystal that developed in the upper part of a Si melt in the early stage of growth of a method for producing a Si bulk polycrystal ingot of an embodiment of the present invention; (a) is a plan view of observation immediately after crystallization, and (b) is a plan view of observation after some time of growth.

FIG. 4 shows a method for producing a Si bulk polycrystal ingot of an embodiment of the present invention; (a) is a photo taken by an optical microscope of a growth interface showing that the growth interface shape could be controlled so as to protrude downwardly when cooling gas was used as coolant, and (b) is a photo taken by an optical microscope of a growth interface showing that the growth interface is flat when coolant is not used.

FIG. 5 shows a method for producing a Si bulk polycrystal ingot of an embodiment of the present invention; (a) is an orientation analysis drawing by electron beam diffraction showing that a Si bulk polycrystal ingot having coarse grains with uniform grain orientation was realized when cooling gas was used as coolant, and (b) is an orientation analysis drawing by electron beam diffraction showing that orientation distribution increases when a heat removal amount is excessive.

FIG. 6 shows a method for producing a Si bulk polycrystal ingot of an embodiment of the present invention when cooling gas is used as coolant; (a) is a spatial distribution drawing of integrated intensity of an X-ray rocking curve showing that the Si bulk polycrystal ingot having coarse grains with uniform grain orientation was realized, and (b) is a spatial distribution drawing of sub-grain boundary density obtained from the peak number of the X-ray rocking curve-1.

FIG. 7 is a plan view of observation showing a dendrite crystal that developed in the upper part of a Si melt in the early stage of growth when cooling gas was used as coolant and a seed crystal was inserted in the vicinity of the center part of the upper face of the melt in a method for producing a Si bulk polycrystal ingot of an embodiment of the present invention.

BEST MODES FOR CARRYING OUT THE INVENTION

The present invention will be described below in detail referring to drawings.

Figure 1:
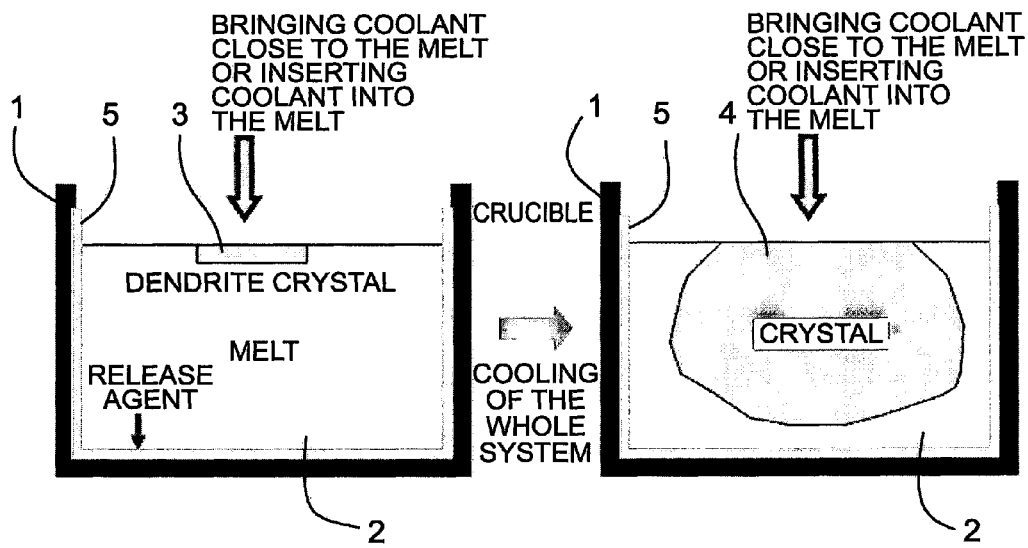
FIG. 1 is a side view showing a basic concept of a method for producing a Si bulk polycrystal ingot of an embodiment of the present invention.
Figure 2:
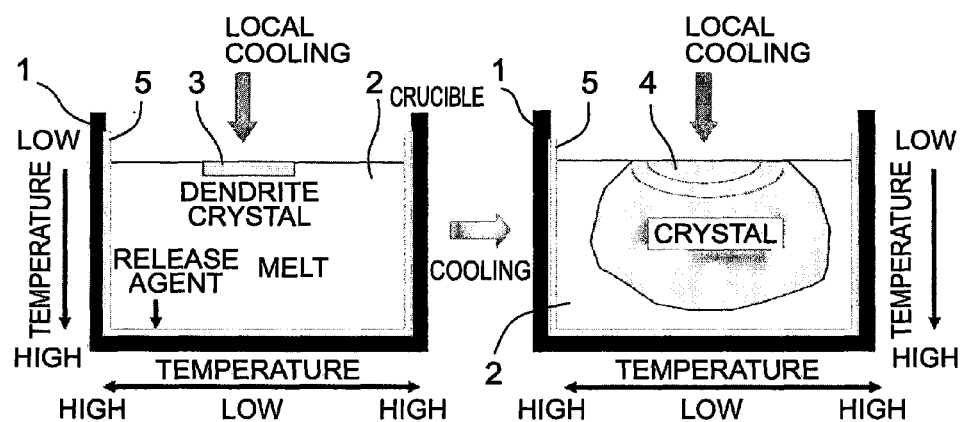
FIG. 2 is a side view clearly showing a temperature distribution of a basic concept of a method for producing a Si bulk polycrystal ingot shown in FIG. 1.

FIG. 1 is a schematic drawing showing a basic concept of the present invention. By properly setting the temperature of a plurality of heat generating bodies whose temperature is independently controllable, the temperature distribution of a Si melt 2 inside a crucible 1 is adjusted so that the temperature becomes lower as it goes toward the upper part of the Si melt 2 and the temperature becomes lower as it goes toward the center of the Si melt 2. The temperature gradient in the vertical direction and the horizontal direction is to be adjusted to 0.1-50 DEG.C/cm, and the temperature distribution described above is to be made satisfied. FIG. 2 is a schematic drawing clearly showing the temperature distribution. Next, the upper part of the Si melt 2 is excessively cooled locally by bringing coolant close to the surface of the Si melt 2 from the upper part of the crucible 1 or by insertion, and dendrite crystals 3 are made to develop in the upper part of the Si melt 2. At this time, the coolant is to be blown to the surface of the Si melt 2 through a tubular object and the like, or alternatively, the coolant is to be configured to be introduced by insertion in a tubular manner to the upper part of the Si melt 2 (not specifically shown). Then, a Si bulk polycrystal ingot 4 is grown from the upper part toward the lower part using the lower face of these dendrite crystals 3 as a fresh growth face.

350 g of Si material was prepared and was inserted to the crucible 1 of a 70 mm inner diameter coated with a release agent 5, the temperature of all of a plurality of heat generating bodies was set higher than the melting point of Si, Si was entirely molten and the Si melt 2 was obtained. Next, the set temperature was changed and the temperature gradient was set so that the upper part of the Si melt 2 became low. Under this condition, cooling gas as coolant was blown to the center part in the upper part of the surface of the Si melt 2 from the upper part of the crucible 1.

Crystallization and growth of the dendrite crystal 3 was observed from an inspection hole in the upper part of a growing apparatus. FIG. 3 is an observation example of the dendrite crystal 3 developed in the upper part of the Si melt 2 in the early stage of the growth. FIG. 3 (a) is the crystal immediately after crystallization, and FIG. 3 (b) is the grown crystal. As shown in FIG. 3, it is known that a single dendrite crystal 3 is developed in the upper part of the Si melt 2 and the crystal becomes coarse in the center part of the Si melt 2 where the cooling gas was blown to.

The temperature of the Si melt 2 during growth was lowered by 80 DEG.C for 160 minutes at a cooling rate of 0.5 DEG.C/min while the cooling gas was allowed to flow. Further, by cooling down to the room temperature, the Si melt 2 was entirely solidified, and a Si (silicon) bulk polycrystal ingot 4 was obtained.

After the growth finished, the Si bulk polycrystal ingot 4 grown was taken out from the crucible 1 and was cut at a plane perpendicular to a main chain of the dendrite crystal 3 which had become coarse in the center part. Further, a sample that had been made wafer-like was etched using a solution obtained by dissolving sodium nitrite in hydrofluoric acid, thereby the growth interface was observed with an optical microscope.

FIG. 4 (a) is a photo showing that the growth interface shape could be controlled so as to protrude downwardly by local cooling. FIG. 4 (b) is a photo showing that the growth interface is flat when local cooling is not performed. As shown in FIG. 4 (a), it is known that the interface shape was controlled so as to protrude downwardly by performing local cooling. In other words, it is known that the contact of the crystal and the crucible could be inhibited. On the other hand, when growth is performed without allowing the cooling gas to flow as FIG. 4 (b), the interface shape is generally flat, and it is known that growth takes place in a state the crystal and the crucible contact with each other when local cooling is not performed.

FIG. 5 is a result of crystal orientation analysis obtained from the spatial distribution of a Kikuchi pattern of the electron beam diffraction, and the grain with different crystal orientation is represented by different brightness. FIG. 5 (a) is a crystal orientation analysis result showing that the Si bulk polycrystal ingot having coarse grains with uniform grain orientation was realized when the flow rate of the cooling gas was appropriate. It is known that in an approximately 4 cm×4 cm region surrounded by solid lines in the center part of the Si bulk polycrystal ingot, only one (110) plane is possessed. Because the plane perpendicular to the main chain of the dendrite was (110) plane, the main chain grew in [110] direction, a dendrite crystal whose lower face was (112) plane developed in the center part of the upper part of the melt in the early stage of growth, a crystal in the center part of the sample grew using the lower face of the dendrite crystal as a fresh growth face, therefore coarse grains with uniform orientation were obtained. FIG. 5 (b) is a crystal orientation analysis result showing that the crystal orientation distribution increases when a removal heat amount is excessive.

The crystal was installed on an XY stage, and a spatial distribution of {220} rocking curve of a coarse grain having a {110} plane was measured using an X-ray source of approximately 2 mm diameter. FIG. 6 (a) is a spatial distribution of integrated intensity of the X-ray rocking curve, and FIG. 6 (b) is a spatial distribution of sub-grain boundary density obtained from the peak number of the rocking curve-1. When a sub-grain boundary is present, the peak of the rocking curve splits and a plurality of peaks appear, therefore the peak number of the rocking curve-1 corresponds to the sub-grain boundary density.

In FIG. 6 (a), it is known that generally constant integral intensity is shown in the region of approximately 4 cm×4 cm. This shows that a same diffraction condition is satisfied and shows that orientation of the crystals is well uniform. Also, as known from FIG. 6 (b), the rocking curve shows a single peak over generally entire region within the grain, and a sub-grain boundary is not present except a minute region in the left lower corner. The region where the sub-grain boundary is present is the region that contacted with the crucible face and was subjected to stress in the later stage of growth, and it is known that preventing from contacting with the crucible is effective in inhibiting generation of sub-grain boundaries.

Also, 350 g of Si material was prepared and was inserted to the crucible 1 of 70 nut inner diameter coated with a release agent 5, all the temperature of a plurality of heat generating bodies was set higher than the melting point of Si, Si was entirely molten, and the Si melt 2 was obtained. Next, the set temperature was changed and the temperature gradient was set so that the upper part of the Si melt 2 became low. A Si (100) single crystal was inserted while allowing the cooling gas to flow, and cooling was performed at a cooling rate of mainly 0.5 DEG.C/min. As a result, the Si melt 2 was entirely solidified and a Si (silicon) bulk polycrystal ingot 4 was obtained.

FIG. 7 is the result of observation through the inspection window in the upper part of the growing apparatus. It is known that the dendrite crystal 3 develops from the vicinity of the center part in the upper part of the melt where a seed crystal was inserted and grows toward outside.

After the growth finished, the Si bulk polycrystal ingot 4 grown was taken out from the crucible 1, was cut out in the lateral direction, and a wafer-like sample was obtained.

Figure 8:
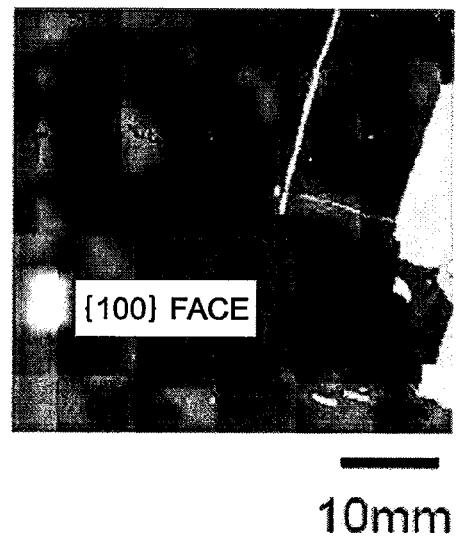
FIG. 8 is a result of crystal orientation analysis measured by electron beam diffraction showing that a Si bulk polycrystal ingot having coarse grains with uniform orientation was realized when cooling gas was used as coolant and a seed crystal was inserted in the vicinity of the center part of the upper face of the melt in a method for producing a Si bulk polycrystal ingot of an embodiment of the present invention.

FIG. 8 is the result of crystal orientation analysis of the Si bulk polycrystal ingot in the region of approximately 5 cm×5 cm in the upper part. With the exception of a twin crystal section observed in the center of the main chain section of the dendrite, the crystal orientation was {100} inheriting the orientation of the seed crystal. Thus, use of a Si single crystal as a coolant is also useful in obtaining a coarse grain with uniform orientation.

Figure 9:
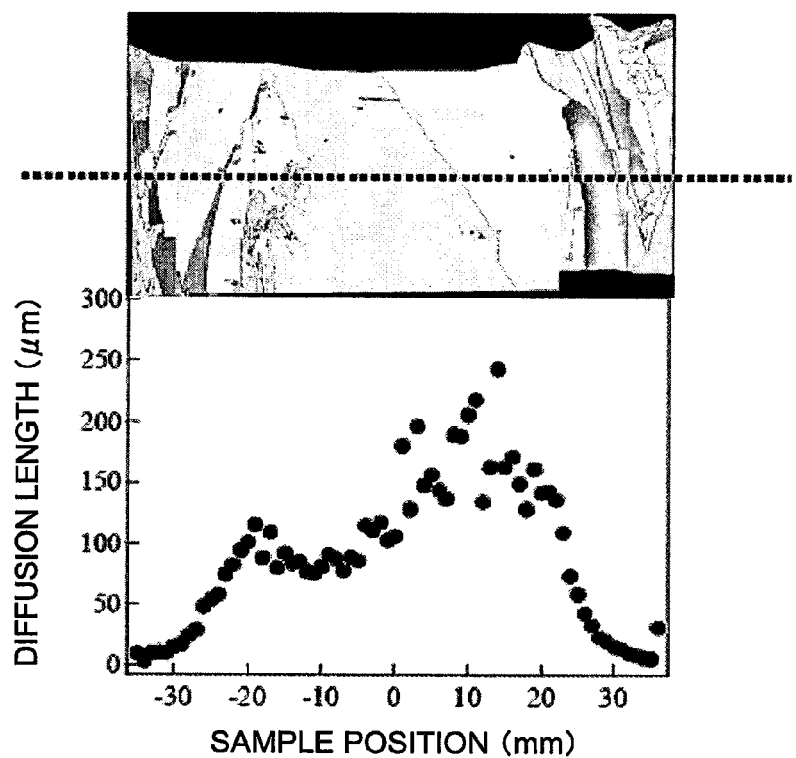
FIG. 9 is a map of the minor carrier diffusion length of the center part of the crystal showing that a high minority carrier diffusion length can be obtained in coarse grains with uniform orientation in a method for producing a Si bulk polycrystal ingot of an embodiment of the present invention.

FIG. 9 is the distribution of the minority carrier diffusion length of the center part of the crystal measured by surface photovoltage (SPV) method. Even if gettering processing for impurities was not performed, the value of the diffusion length shows approximately 100-250 μm in the coarse grains with uniform orientation in the center. The value of the diffusion length of a crystal grown by a conventional technique using same material and growing apparatus was 50 μm or below. Thus, it is shown that the crystal was of high purity with low density of impurities because high diffusion length was obtained even if the gettering processing was not performed, and it is known that the efficiency of a solar cell can be improved because high diffusion length was obtained.

The method for producing a Si bulk polycrystal ingot for a solar cell of the present invention can be realized by slight modification of introducing a local cooling system, a control system of temperature distribution and the like on a practical manufacturing apparatus of the cast growth method, and a Si bulk polycrystal ingot with high quality and high homogeneity can be produced with a high yield.

The present invention is not to be limited to the present embodiment and appropriate alterations can be implemented within the range not departing from the purposes of the present invention. The kind of coolant may be appropriately changed depending on the production apparatus such as the temperature distribution and the volume of the melt used.

REFERENCE NUMERALS

1: Crucible
2: Si melt
3: Dendrite crystal
4: Si bulk polycrystal ingot
5: Release agent

The invention claimed is:

1. A method for producing a Si bulk polycrystal ingot, comprising the steps of:
maintaining a Si melt in a crucible with a temperature gradient that the higher in a vertical direction, the lower the temperature and the lower in the vertical direction, the higher the temperature;
after maintaining the Si melt with the temperature gradient, locally cooling to increase degree of excessive cooling an upper face of the Si melt by directing a coolant toward the center part of the upper face of the Si melt or by inserting the coolant or a seed crystal into the Si melt;
forming a dendrite crystal in an upper part of the Si melt;
performing cooling thereafter while maintaining a proper temperature distribution; and
growing a Si bulk crystal from the upper part of the Si melt toward a lower part of the Si melt using a lower face of the dendrite crystal as a fresh growth face.

2. A method for producing a Si bulk polycrystal ingot, comprising the steps of:
maintaining a Si melt inside a crucible for growing a crystal with a temperature gradient that the higher in a vertical direction, the lower the temperature, and the closer to the center in a horizontal direction, the lower the temperature;
after maintaining the Si melt with the temperature gradient, cooling an upper face of the Si melt locally to increase degree of excessive cooling by directing a coolant toward the center part of the upper face of the Si melt or by inserting the coolant or a seed crystal into the center part of an upper part of the Si melt;
making a dendrite crystal develop in the upper part of the Si melt;
performing cooling thereafter while maintaining a proper temperature distribution; and
growing a Si bulk crystal from the upper part of the Si melt toward a lower part of the Si melt using a lower face of the dendrite crystal as a fresh growth face.

3. The method for producing a Si bulk polycrystal ingot according to claim 1, wherein:
directing the coolant toward the center part of the upper face of the Si melt comprises blowing a predetermined cooling gas; or
the coolant inserted into the Si melt is a quartz bar, a carbon bar, a silicon carbide bar, a silicon nitride bar, or a metal bar; or
the seed crystal inserted into the Si melt is a Si-based single crystal, a polycrystal, or a composite crystal thereof.

4. The method for producing a Si bulk polycrystal ingot according to claim 1, wherein:
the dendrite crystal develops by cooling the upper part of the Si melt locally using a predetermined cooling gas; or
the dendrite crystal develops by cooling the upper part of the Si melt locally with the coolant selected from the group consisting of a quartz bar, a carbon bar, a silicon carbide bar, a silicon nitride bar, and a metal bar, or the seed crystal selected from the group consisting of a Si-based single crystal, a polycrystal, and a composite crystal thereof.

5. The method for producing a Si bulk polycrystal ingot according to claim 1, wherein:
the upper part of the Si melt is locally cooled by blowing a predetermined cooling gas and inserting into the Si melt the seed crystal selected from the group consisting of a Si-based single crystal, a polycrystal, and a composite crystal thereof, or a coolant selected from the group consisting of a quartz bar, a carbon bar, a silicon carbide bar, a silicon nitride bar, and a metal bar.

6. The method for producing a Si bulk polycrystal ingot according to claim 2, wherein the temperature gradient is set to make the temperature gradient in the vertical direction from the upper face of the Si melt to the bottom face of the crucible 0.1-50° C./cm and to make the temperature gradient in the horizontal direction from the center part to the peripheral part of the crucible 0.1-50° C./cm.

7. The method for producing a Si bulk polycrystal ingot according to claim 1, wherein the temperature of the center part of the Si melt prior to growth is maintained at a temperature within −20° C. to +20° C. of the melting point of the Si melt.

8. The method for producing a Si bulk polycrystal ingot according to claim 3, wherein the cooling gas is selected from the group consisting of helium, neon, argon, xenon, nitrogen, hydrogen, and combinations thereof.

9. The method for producing a Si bulk polycrystal ingot according to claim 1, wherein:
the lower face of the dendrite crystal is [110] or [112]; and
a fluctuation range of the growth orientation of the Si bulk crystal is −10° to +10°.

* * * * *